United States Patent

Mars et al.

[15] 3,646,399

[45] Feb. 29, 1972

[54] PRINTED CIRCUIT BOARD CONSTRUCTION

[72] Inventors: James R. Mars, Pittsfield; Frederick S. Ciepiela, North Adams, both of Mass.

[73] Assignee: General Electric Company

[22] Filed: Mar. 4, 1970

[21] Appl. No.: 16,389

[52] U.S. Cl. ..................................317/100, 29/625, 29/626, 174/68.5, 317/101 CC, 317/101 CM

[51] Int. Cl. ........................................H02b 1/00, H05k 1/18

[58] Field of Search..............174/68.5, 15 HS; 317/100, 101, 317/234; 29/626, 625

[56] References Cited

UNITED STATES PATENTS 3,372,310 5/1968 Kantor.............................317/101 CP

*Primary Examiner*—Darrell L. Clay

*Attorney*—Francis K. Richwine, Carl W. Baker, Frank L. Neuhauser, Oscar B. Waddell and Joseph B. Forman

[57] ABSTRACT

A composite circuit board assembly is formed having a laminated-type construction including surface layers of thermally conducting material having spaced openings for location of recessed mounting means for the electrical components. The openings can be etched after lamination of a composite layer which provides the heat-sink function and the assembly means. Alternately, a thermally conducting layer can be laminated upon a substrate already having the openings and an overlayer of electrically conducting material which provides the assembly means can be pressed into the openings and thereafter etched to form the assembly sites.

6 Claims, 4 Drawing Figures

INVENTORS
JAMES R. MARS
FREDERICK S. CIEPIELA

BY J.F. McDevitt
THEIR ATTORNEY

INVENTORS
JAMES R.MARS
FREDERICK S.CIEPIELA

BY J.F. McDevitt

THEIR ATTORNEY

INVENTORS
JAMES R. MARS
FREDERICK S. CIEPIELA

BY J. F. McDevitt

THEIR ATTORNEY

PRINTED CIRCUIT BOARD CONSTRUCTION

BACKGROUND OF THE INVENTION

The conventional method to dissipate heat from a printed circuit board designed to have discrete electrical components assembled thereupon is to mechanically attach a heat-exchange frame having openings for assembly of said components to an outer layer of the board which already has the assembly sites. A number of thermal resistances are encountered by this technique which cannot be entirely overcome by laminating the heat-exchange frame directly to a substrate containing the assembly sites. Electrical separation between the heat-exchange frame and the assembly sites is not easily maintained by either of the foregoing methods especially in view of the fact that the assembly sites in the heat-sink layer are often located in the same plane. It has now been discovered that a composite heat-sink and electrical interconnection member can be fabricated having improved heat removal capability and providing more reliable means to construct such a multilayer circuit board assembly. By utilizing the present interconnection member it becomes possible to mount electrical the electrical components for the entire multilayer circuit board assembly directly to the interconnection member with smaller risk of developing an electrical short circuit with the heat-exchange surface and to provide electrical connection between said electrical components and internal printed circuit board members while also enabling edge electrical connection from said interconnection member to external electrical circuitry.

It is an important object of the invention therefore to provide a novel interconnection member for printed circuit board construction having integral heat-sink and electrical component mounting means.

It is another important object of the invention to provide a novel multilayer circuit board construction having a bonded interconnection member for mounting discrete electrical components to the assembly and which provides means for heat removal and electrical connection to the assembly.

It is still another important object of the invention to provide novel means to fabricate a multilayer circuit board assembly of the invention.

In accordance with a preferred embodiment of the present invention an interconnection member is provided having a base layer of dielectric material, a layer of thermally conducting material laminated to said base layer and having openings for location of assembly means used to mount electrical components thereto, and assembly sites in said openings fabricated from an electrically conducting material bonded to the base layer and recessed below the outer surface of said thermally conducting layer. Internal electrical connections from said interconnection member to subjacent printed circuit board layers can be provided by conventional means such as plated-through holes, electrically conducting pins and combinations thereof to form an electrical circuit path for the connected electrical components. External electrical connections from the interconnection member to operatively associated remote electrical circuitry can be provided along one edge of the member for interference fit or joinder with a conventional circuit board terminal block. The relief profile at the edge connection means of said novel composite circuit board assembly can be used to mate with a matching configuration provided by another circuit board member to effect a different manner of external electrical termination.

These and other objects, features, and advantages of the present invention will become apparent upon consideration of the following detailed description when considered in connection with the accompanying drawings which illustrate preferred embodiments of the present invention.

Figure 1:
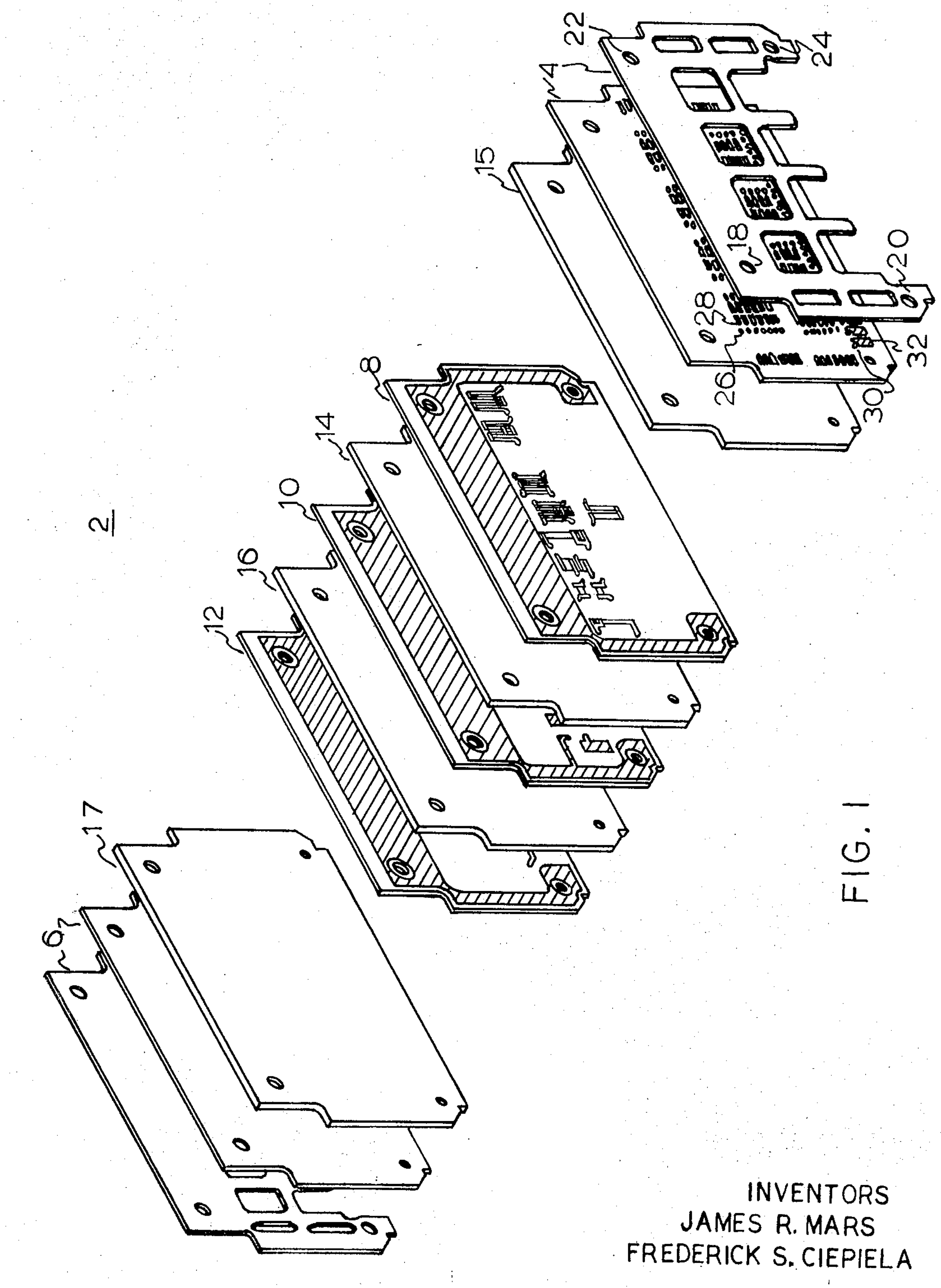
FIG. 1 is a three-dimensional view for a multilayer circuit board assembly utilizing the interconnection member of the present invention.

In FIG. 1 there is shown a three-dimensional exploded view of the individual board members which are bonded together to form a multilayer circuit board construction incorporating the features of the present invention. The multilayer circuit board assembly 2 comprises composite interconnection members 4 and 6 forming oppositely disposed surface members of the assembly; double-sided printed circuit board members 8, 10 and 12 located between said interconnection members; and dielectric spacer layers 14 and 16 separating said printed circuit board members from one another. One or more similar spacer layers 15 and 17 which all can be fabricated from commercially available glass fiber-impregnated epoxy resin material serve to electrically isolate but enhance the heat transfer between the interconnection members 4 and 6, respectively, and the subjacent printed circuit board members. The entire multilayer circuit board assembly can be bonded together solely by curing the spacer layers with heat and pressure to provide the electrical isolation between all successive members in said assembly except at the internal electrical connection means formed in the pad and tab areas as hereinafter described. Registry holes 18–24 can be provided in each interconnection member as well as in all internal board and spacer members to enable accurate registration of the individual components when assembled. While the interconnection members have been shown in this drawing for ease of understanding as containing the pad and tab areas 26 and 28, respectively, for connection of the electrical components, it should be noted that such features may be fabricated after assembly of the above-described multilayer board configuration to facilitate the precise location needed for the internal electrical connection means. Pads 26 and 30 provide the sites for said internal electrical connection whereas tabs 28 and 32 provide external electrical connection means from the multilayer board configuration to associated electrical circuitry.

Figure 2:
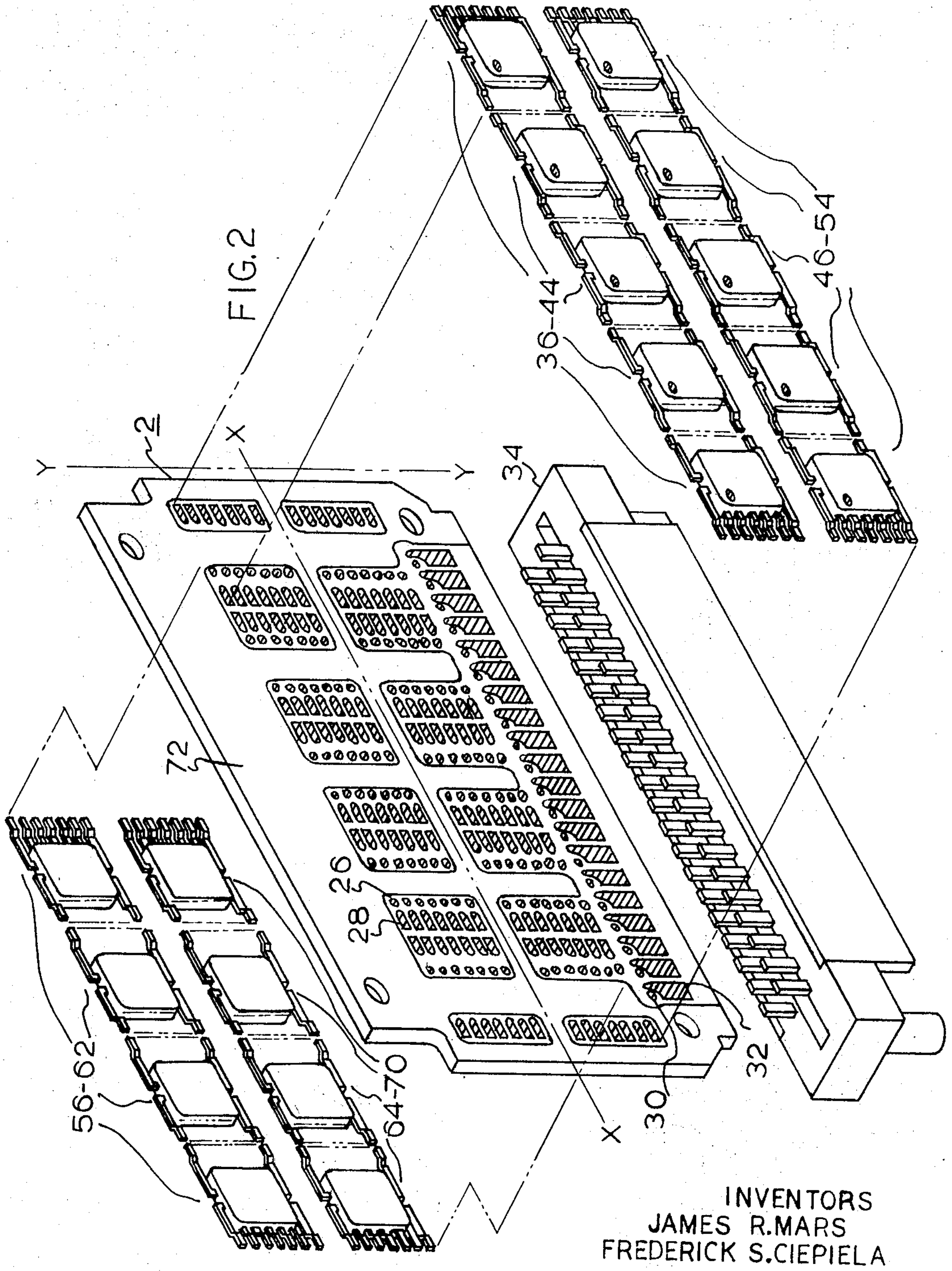
FIG. 2 is another three-dimensional view depicting a multilayer circuit assembly of the present invention having electrical components mounted upon the opposing major surfaces.

A different three-dimensional exploded view of the multilayer board assembly of the invention is shown in FIG. 2 having external electrical components mounted upon the two opposing major surfaces of the board assembly 2 and a terminal block connector 34 attached to the bottom edge of said assembly. Accordingly, a plurality of conventional packaged electrical components 36–44, which can be thin film circuit devices or other circuit components, are joined to the tab areas 28 as shown in the drawing. Correspondingly, a plurality of other similar devices 46–54 are also joined to the board assembly on the same side by soldering, electrically conducting cement, or other conventional joining technique. Groups of other electrical components 56–62 and 64–70 are mounted upon the opposite side of the board assembly in a similar fashion. Internal electrical connection between said electrical components and the circuit paths defined by the subjacent printed circuit board members of the board assembly can be obtained by means of connector holes (shown in successive drawings) drilled in the pad and tab areas 26 and 28, respectively, and which lead to opposite side of the board assembly. External electrical connection to the board assembly is provided at the tab areas 32 which are joined to connector block 34.

An important feature which should be noted in the above-described embodiment is the particular spatial registration between the packaged electric components on opposite sides of the board assembly. By reason of the manner used to obtain internal electrical connection in said board assembly wherein holes may be drilled through said structure it becomes necessary to offset opposing electrical components on each side of said structure to preclude a direct electrical path therebetween at the holes. This feature is accomplished in said embodiment by having the pad and tab areas on each side of the board assembly offset with respect to one another along the X—X axis so that a connector hole drilled in a perpendicular direction through said structure from a given pad area on one side does not encounter a pad area on the opposite side but intercepts a tab area having an electrical component joined thereto. The pad and tab areas on each side of the board assembly can have the same dimensions and spacing along the Y—Y axis shown to permit use of standard size components which in the above-described embodiment results in mounting a larger number of electrical components on one side of the board assembly as shown. The offset spacing of the electrical components on opposite sides of the board assembly along said X—X axis can be considered as a repeating pattern having an electrical component on a given side located between two electrical components on the opposite side of said board assembly and enables an optimum packaging density for standard size components. While the above-described interposition of the electrical components on each side of the board assembly provides a heat-exchange area 72 for the structure which is unencumbered by the electrical components, it can be appreciated that other dispositions for said components are possible that still adhere to the offset principle. For example, the electrical components on each side of the board assembly can be interposed along the Y—Y axis and the pad and tab areas adjusted accordingly to provide still another manner of mounting the components achieving an optimum packaging density.

Figure 3:
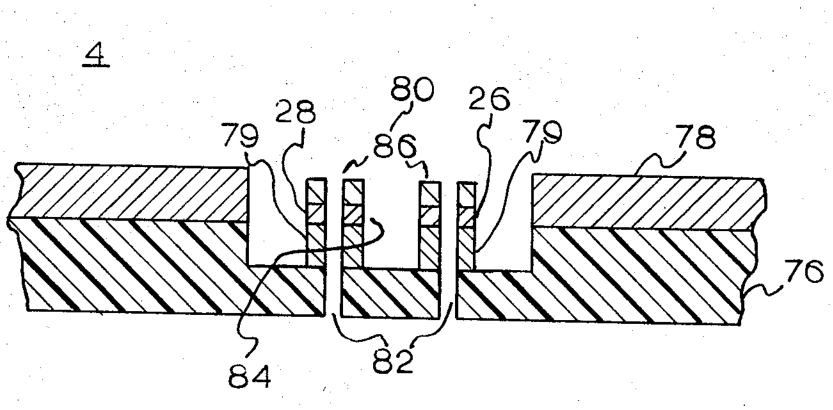
FIG. 3 is a cross-sectional view showing one preferred form of the interconnection member used in practice of the invention.

A cross-sectional view for one interconnection member 4 in the above-described multilayer circuit board assembly is shown in FIG. 3. Said composite member comprises a base layer of dielectric material 76 which can be a commercially available glass fiber-impregnated epoxy resin matrix sheet, layer of thermally conducting material 78 laminated to said base layer and which can be fabricated from aluminum or an aluminum-based alloy with said layer of thermally conducting material having openings for location of the recessed component mounting means, and said mounting or assembly means 26–28 disposed in said openings so as to be recessed below the outer surface of said thermally conducting layer and being affixed to base layer 76. Said mounting means comprise pad 26 and tab 28 elements which are fabricated from an electrically conducting material to provide location sites for internal electrical connection between the mounted electrical components and subjacent printed circuit board members of the assembly. One method to form such an interconnection member begins with etching a window pattern in a copper-clad aluminum sheet to remove all copper except in the window areas and bonding the resultant sheet 78 with an epoxy resin base layer 76 and the internal board members depicted in the FIG. 2 board assembly using heat and pressure so as to embed the copper windows 79 into the resin substrate. A first conventional photoresistive coating is next applied to the aluminum exterior surface and a photographic image of the window openings is then taken whereupon the photoresistive coating is dissolved in said window areas. A conventional etchant solution for aluminum but not for copper removes the exposed metal until the underlying copper is reached to form window openings 80. Electrical interconnection holes 82 are drilled in the window areas through the entire board assembly and said holes are then plated to provide a conducting path to the interior printed circuit board members. A second photoresistive coating is then applied in the window areas and a photographic image is taken of the pad 26 and tab 28 elements which are aligned with the drilled and plated holes. Said photoresistive coating is then removed except at the location sites for said tab elements followed by etching the exposed copper layer to produce the recessed mounting and electrical interconnection means for the board assembly. Additional copper plating 84 can be applied upon the pad and tab elements and a solder coating 86 applied thereupon to facilitate attachment of the external electrical components by otherwise conventional techniques.

Figure 4:
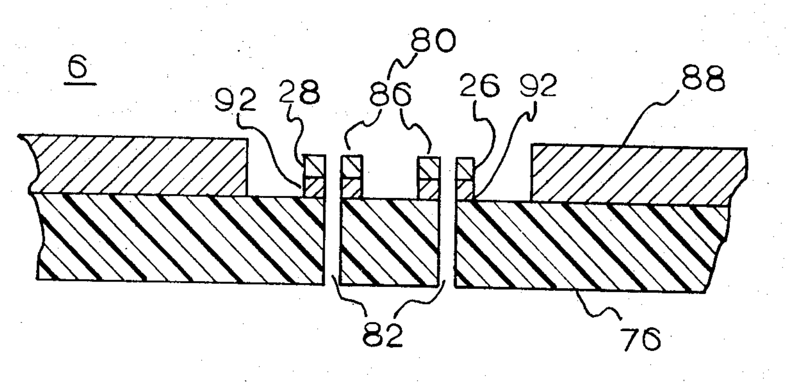
FIG. 4 is another cross-sectional view showing a different preferred interconnection member of the invention.

In FIG. 4 there is shown a cross section for a different interconnection member 6 which is fabricated in accordance with another preferred method of the present invention. The same numeral identification has been retained in the following description to identify those structural elements common to the FIG. 3 embodiment. Accordingly, an aluminum or aluminum alloy sheet 88 having preformed window openings 80 is placed in contact with a copper sheet 92 having no corresponding openings and a mold having raised protuberances (not shown) aligned with the window openings. An uncured glass fiber-impregnated epoxy resin layer 76 is then placed in contact with the aluminum surface to form a matrix of the interconnection member 6 and all remaining members of the entire board assembly 2 are stacked upon said interconnection member matrix in the aforementioned mold using the same order shown in FIG. 1. The assembled configuration is thereupon laminated with heat and pressure in the conventional fashion and the molded assembly is then drilled to provide the holes 82 which form an electrical path to the internal printed circuit board members of the configuration. The holes can be plated to form said electrically conducting path prior to formation of the recessed pad and tab elements in the window openings. A photoresistive coating is next applied to the exposed surface of the copper layer forming the outermost member of the molded assembly and which said copper layer has been deformed into the window openings by the molding process. The recessed pad and tab elements 26 and 28, respectively, can be etched and solder applied thereto in the same manner heretofore described for the FIG. 3 embodiment to form the composite mounting and internal electrical connection means located in the window openings of the board assembly.

It will be apparent from the foregoing description that variations can be made in the multilayer board assembly and the interconnection member as well as the methods for producing said objects without departing from the true spirit and scope of this invention. It is not intended to limit the invention, therefore, to the scope of the preferred embodiments above described since it will be apparent that various modifications are possible within the scope of the appended claims.

What I claim as new and desire to be secured by Letters Patent in the United States is:

1. A composite board member for a multilayer circuit board comprising a dielectric core containing electrical circuitry embedded therein in prearranged pattern bonded between two layers of thermally conducting material, said two layers having a plurality of nonregistering window openings exposing said core, electrically conducting pads and tabs arranged in predetermined geometrical pattern on said core within said window openings of said layers, said pads and tabs being electrically connected to said circuitry, electrically isolated from and physically recessed within said layers, said geometrical pattern permitting the mounting of cased integrated circuit components in crab fashion between groups of tabs in adjoining window openings in thermally conducting contact with said thermally conducting material between window openings.

2. A composite board member mounting for cased integrated circuit components for use in a multilayer printed circuit board assembly comprising a laminar board having a dielectric core containing embedded electrical circuitry in prearranged pattern, a multimetallic exterior strata on each side of said core, said multimetallic strata consisting of metallurgically joined sheets of different metals including at least a conductor sheet of a metal selected for its electrical conducting qualities and a heat-sink sheet of metal selected for its thermal conducting properties placed with the thermal conducting material on the exterior of the board structure, geometrically arranged and spaced windows in said heat-sink sheet exposing said conductor sheet, said heat-sink sheet having its exterior surface anodized to form an electrically insulating surface, said conductor sheet being selectively etched through within said windows to leave distinct geometrically arranged electrically isolated pads and tabs of said conductor sheet, said pads and tabs being recessed with respect to said exterior surface of said heat-sink, each said pad and tab being individually selectively connected to a portion of said electrical circuitry within said core, said geometrical arrangement of said pads and tabs being such as to permit mounting of cased integrated circuit components of established configuration between proximate rows of tabs of adjacent windows whereby said cased components when terminated on said tabs are inserted electrically into said circuitry and electrically insulated from but thermally in contact with the anodized surface of said heat-sink sheet on the undisturbed portions thereof between said adjacent windows, said pads and tabs also including terminal pads and tabs proximate one edge of said board for electrically inserting said circuitry into said assembly.

3. The board structure of claim 2 wherein said pads and tabs are in alternate rows on each side of said board with pads and tabs opposite.

4. The board structure of claim 2 wherein said windows on one side of said board are offset 50 percent with windows on the opposite side causing heat sink areas between windows on opposite sides to be at maximum separation.

5. The board structure of claim 4 wherein said pads and tabs are in alternate rows on each side of said board with pads and tabs opposite whereby integrated circuit components attached to said tabs and supported by raised heat-sink separations between windows alternate from side to side in comb fashion.

6. The structure of claim 5 wherein said cased integrated circuit component devices are in electrical contact with and attached to said tabs and are in thermal contact with said heat-sink sheet.

* * * * *